United States Patent [19]
Suzuki

[11] 3,887,822
[45] June 3, 1975

[54] FLIP-FLOP CIRCUITS UTILIZING INSULATED GATE FIELD EFFECT TRANSISTORS

[75] Inventor: Yasoji Suzuki, Kawasaki, Japan

[73] Assignee: Tokyo Shibaura Electric Co., Ltd., Kawasaki-shi, Japan

[22] Filed: Aug. 3, 1973

[21] Appl. No.: 385,247

[30] Foreign Application Priority Data

Aug. 31, 1972 Japan .................... 47-87457

[52] U.S. Cl. ............ 307/279; 307/205; 307/215; 307/218; 307/288

[51] Int. Cl. .. H03k 3/286; H03k 3/33; H03k 19/08

[58] Field of Search ......... 307/205, 214, 215, 218, 307/269, 279, 288, 289

[56] References Cited

UNITED STATES PATENTS

| | | | |
|---|---|---|---|
| 3,510,787 | 5/1970 | Pound et al. | 307/205 X |
| 3,588,545 | 6/1971 | Wright | 307/289 |
| 3,683,201 | 8/1972 | Haraszti | 307/205 |
| 3,737,673 | 6/1973 | Suzuki | 307/215 X |
| 3,739,193 | 6/1973 | Pryor | 307/205 |
| 3,766,408 | 10/1973 | Suzuki et al. | 307/279 X |

*Primary Examiner*—Michael J. Lynch
*Assistant Examiner*—L. N. Anagnos
*Attorney, Agent, or Firm*—Flynn & Frishauf

[57] ABSTRACT

A flip-flop circuit utilizing insulated gate field effect transistors or MOS transistors and operating as a set dominant type or a reset dominant type includes a delayed logic circuitry having a three-input logic circuit comprised of an AND-NOR gate constituted by P and N channel MOS transistors, and P and N channel clocked MOS transistors for operating the logic circuit in synchronism with a clock signal and a complement thereof. The output of the delayed logic circuitry is reversed in polarity by a first complementary MOS inverter. The three-input logic circuit receives a first logical input through a second complementary MOS inverter, a second logical input, and the output of the flip-flop circuit.

24 Claims, 14 Drawing Figures

FLIP-FLOP CIRCUITS UTILIZING INSULATED GATE FIELD EFFECT TRANSISTORS

This invention relates to a flip-flop circuit constituted by insulated gate field effect transistors (IG transistors) or metal oxide semiconductor field effect transistors (MOS transistors).

With recent remarkable advances in the art of integrated circuits the dimensions of the circuit elements have been greatly reduced so that the number of circuit functions which can be provided by a semiconductor chip of a given area has been increased greatly. Furthermore, the diameter of a semiconductor wafer that can be formed at a high yield has also been increased. The user's requirement for providing a larger number of circuit functions by a single chip has also been increased so that at present it is possible to use large scale integrated circuits (LSI) which permits provision of several thousands of circuit elements in a single chip. Accordingly, it is a recent trend to form an electronic desk top calculator, for example, with only one or two chips. Under these circumstances, it is necessary to minimize the area occupied by a circuit element providing one function and to minimize the number of circuit elements constituting the circuit.

An R-S flip-flop circuit having a single function and suitable for use in control and timing circuits of an electronic desk top calculator and other electronic apparatus is generally constructed as a bistable circuit system or a delay circuit (shift register) system.

Where an R-S flip-flop circuit is fabricated with MOS transistors having a highly capacitive input impedance it is possible to readily form a delay circuit system in which the charge and discharge of the input capacitance of the MOS transistor can be used to provide data, the delay circuit system being more advantageous than the bistable circuit system in that there is no input prohibiting condition.

It is an object of this invention to provide an improved set dominant or reset dominant flip-flop circuit which is suitable to be fabricated as an integrated circuit and in which the number of the circuit elements included therein can be reduced.

SUMMARY OF THE INVENTION

According to this invention, there is provided a flip-flop circuit utilizing insulated gate field effect transistors wherein when the states of first and second logical inputs are in a predetermined combination, the output state of the flip-flop circuit is held, and when the states of the first and second logical inputs are in other combinations, either one of the first and second logical inputs is dominantly derived out on the output side in response to clock signals, characterized in that the flip-flop circuit comprises first inverter means including a complementary pair of field effect transistors for reversing the polarity of the first logical input; delayed logic circuit means comprising logic gate means which includes two different type logic circuits comprised of a plurality of N channel transistors and a plurality of P channel transistors and receives the output of the first inverter means, the second logical input and the output of the flip-flop circuit, and clocked means responsive to a first clock pulse signal and a complement thereof for deriving out the output of the logic gate means as the output of the delayed logic circuit means; and second inverter means including a complementary pair of field effect transistors for reversing the polarity of the output of the delayed logic circuit means to provide the output of the flip-flop circuit.

DETAILED DESCRIPTION OF ILLUSTRATED EMBODIMENTS

A MOS transistor is provided with a source region and a drain region which define a conduction path therebetween, and a gate electrode disposed on the conduction path with an insulating layer interposed therebetween. The conductivity of the conduction path is controlled by a control voltage impressed upon the gate electrode. Generally, a MOS transistor is made to have a symmetrical construction with respect to the source and drain regions other than those manufactured for special applications, for example for high frequency use. For the sake of description, it is herein defined that the region supplied with a bias voltage is termed the source and the other region the drain. Furthermore, negative logic is used in which the lower voltage level or $-E$ volts is expressed as a binary "1" and the higher voltage level or ground potential as a binary "0".

Figure 1A:
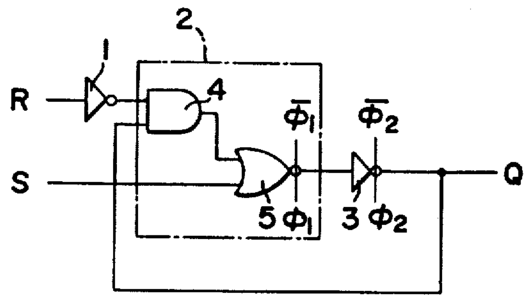
FIG. 1A is a connection diagram of a set dominant flip-flop circuit embodying the invention.

In FIG. 1A illustrating one example of the set dominant flip-flop circuit embodying the invention, a reset input R is coupled with one input of an AND gate 4 through a first inverter means 1 and the output of the AND gate 4 is coupled to one input of a NOR gate 5. A set input S is coupled to the other input of the NOR gate 5. The AND gate 4 and the NOR gate 5 cooperate to constitute a delayed logic circuit 2 operated by a first clock signal and its complement $\phi_1$ and $\bar{\phi}_1$. For this reason, in the block circuit shown in FIG. 1 the NOR gate 5 is shown as a clocked NOR gate operated by the clock signals $\phi_1$ and $\bar{\phi}_1$.

The polarity of the output of NOR gate 5 is reversed by a second inverter means 3 to provide the output Q of the flip-flop circuit. The second inverter means 3 may be constructed by a simple inverter as the first inverter 1 but in the example shown in FIG. 1A the inverter 3 is shown as a clocked inverter which is rendered operative by a clock signal $\phi_2$ and its complement $\bar{\phi}_2$. The output of the second inverter means or the output Q of the flip-flop circuit is fed back to the other input of the AND gate 4.

Figure 1B:
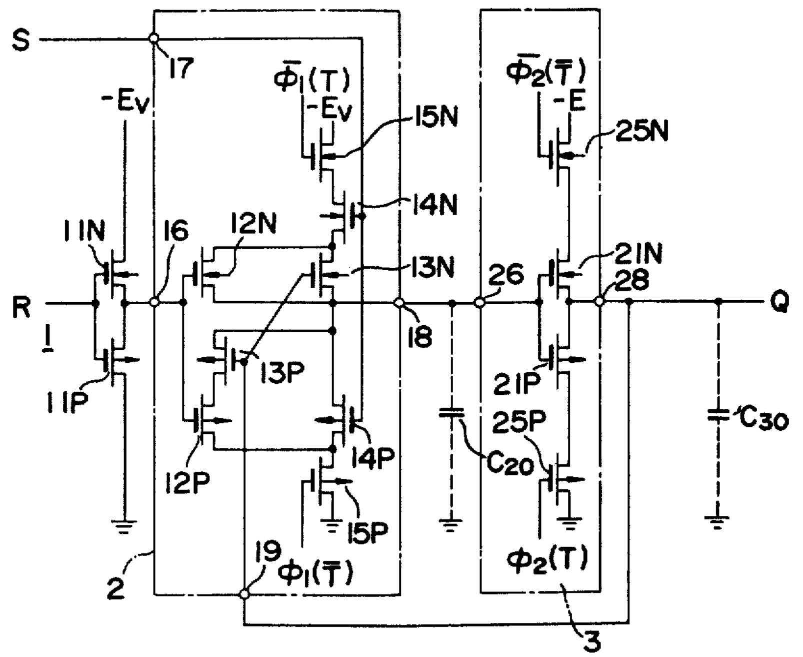
FIG. 1B shows a detailed circuit diagram of the flip-flop circuit shown in FIG. 1A.

With reference now to FIG. 1B which shows the details of the circuit construction of FIG. 1A, the first inverter means 1 is comprised by a well known complementary MOS inverter including an N channel MOS transistor 11N and a P channel MOS transistor 11P.

In the delayed logic circuitry 2, the conduction paths of N channel transistors 12N and 13N are connected in parallel, while the conduction path of an N channel transistor 14N is connected in series with that of the N channel transistor 13N. The conduction path of a P channel transistor 12P is connected in series with that of a P channel transistor 13P and the conduction path of a P channel transistor 14P is connected in parallel with these serially connected conduction paths of P channel transistors 12P and 13P. The conduction path of the N channel transistor 13N is connected in series with that of the P channel transistor 14P and the junction between these two conduction paths is connected to the output terminal 18 of the delayed logic circuitry 2.

These transistors which constitute an AND-NOR gate circuit are connected to sources of bias potentials via N and P channel clocked transistors 15N and 15P. The gate electrodes of transistors 12N and 12P are commonly connected to an input terminal 16 to receive a reset input R via the first inverter means 1, whereas the gate electrodes of transistors 14N and 14P are commonly connected to an input terminal 17 to receive a set input S. The gate electrodes of transistors 13N and 13P are commonly connected to an input terminal 19 to receive the output Q of the flip-flop circuit. The gate electrodes of clocked transistors 15N and 15P are connected to receive the first clock signal $\bar{\phi}_1$ and its complement $\phi_1$ respectively, so that their conductive paths are rendered conductive when $\bar{\phi}_1$ is at a high level or zero level and $\phi_1$ is at a low level or negative level. The second inverter means 3 comprises a basic inverter including a complementary pair of an N channel transistor 21N, and a P channel transistor 21P, and a complementary pair of an N channel clocked transistor 25N and a P channel clocked transitor 25P the conduction paths of which are respectively connected in series with the conduction paths of transistors 21N and 21P. The gate electrodes of clocked transitors 25N and 25P are connected to receive second clock signals $\bar{\phi}_2$ and $\phi_2$, respectively. The input terminal 26 of the second inverter means 3 is connected to the output terminal 18 of the delayed logic circuitry 2, whereas the output terminal of the second inverter means 3 is connected to the input terminal 19 of the delayed logic circuitry 2.

Figure 2:
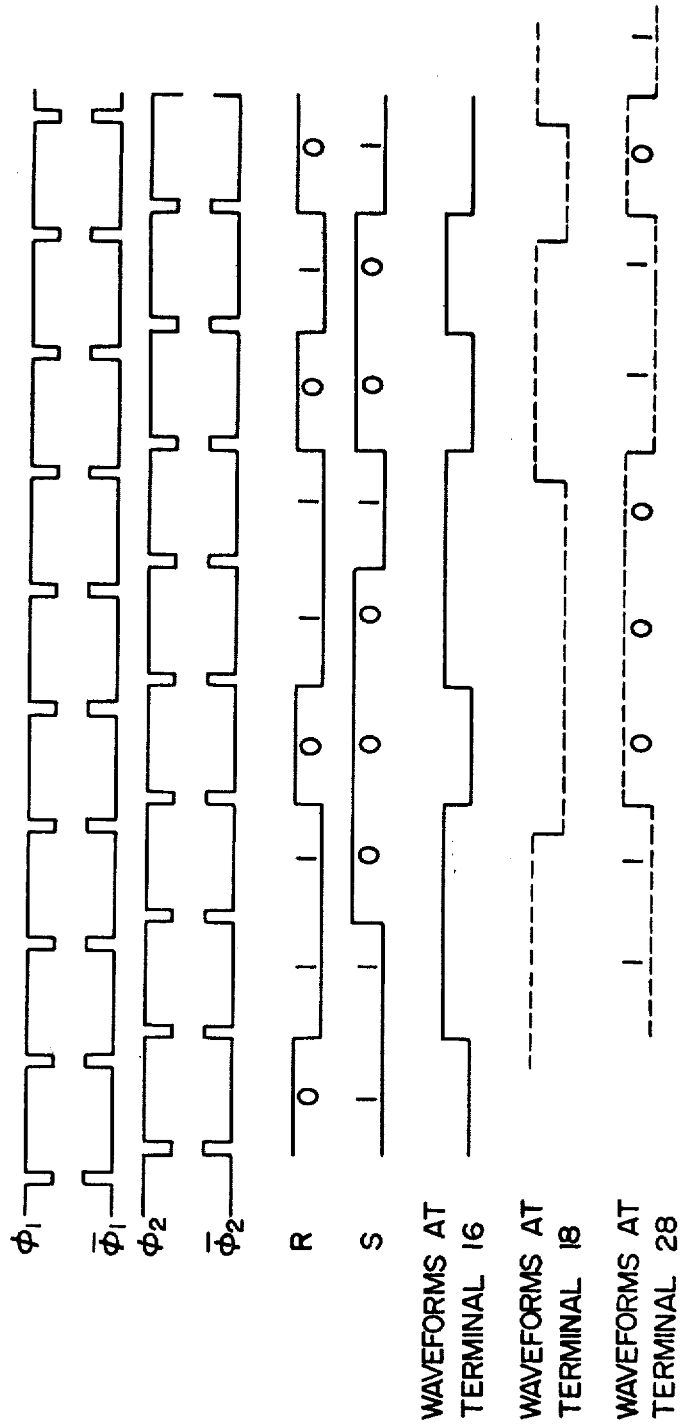
FIG. 2 shows waveforms useful to explain the operation of the flip-flop circuits shown in FIGS. 1A and 1B.

As shown in FIG. 2 clock signals $\phi_1$ ($\bar{\phi}_1$) and $\phi_2$ ($\bar{\phi}_2$) are pulses having a predetermined phase difference and definite periods. Alternatively, the same clock pulses T ($\bar{T}$) can also be used, as shown in FIG. 1B. In any case, the clocked transistors 15N and 15P of the delayed logic circuitry 2 and the clocked transistors 25N and 25P of the second inverter means 3 are enabled alternately.

Of course, the substrates of respective MOS transistors described above are applied with prescribed bias potentials for stable operation. The substrates of respective P channel transistors are grounded and the substrates of respective N channel transistors are connected to a source of −E volts.

The circuit shown in FIG. 1B operates as follows:

i. Where the set input S=0 and the reset input R=0, transistors 11N, 12P and 14N are rendered conductive, whereas transistors 11P, 12N and 14P are rendered nonconductive. Accordingly, the potential condition at the output terminal 18 of the delayed logic circuitry is determined by the output Q previously held and the clock pulses $\phi_1$ and $\bar{\phi}_1$. Thus, for example, under a condition Q=1, when clock pulses $\bar{\phi}_1$ and $\phi_1$ are applied to the clocked transistors 15N and 15P, respectively, transistor 13P is rendered conductive, transistor 13N nonconductive, and transistors 15N and 15P conductive so that the output terminal 18 will be grounded through transistors 13P, 12P and 15P. As a result, the charge of an output capacitor $C_{20}$ is reduced to zero thereby producing an output 0. Upon interruption of the supply of clock pulses $\phi_1$ and $\bar{\phi}_1$, transistors 15N and 15P are rendered nonconductive, whereby the output terminal 18 will be isolated from the source of bias potential and the ground. Consequently, the output capacitor $C_{20}$ stores temporarily the date 0. Then when clock pulses $\phi_2$ and $\bar{\phi}_2$ are applied transistors 25N and 25P become conductive. Since the data 0 stored in the output capacitor $C_{20}$ is impressed upon the input terminal 26 of the second inverter means 3 the transistor 21N is rendered conductive, whereas the transistor 21P nonconductive. As a result, the output terminal 28 will be maintained at −E volts through transistors 21N and 25N, thus producing an output 1 at terminal 28. Under these conditions, the output capacitance $C_{30}$ is charged to a voltage of −E volts so that the output condition Q=1 will be maintained even when the supply of the clock signals $\phi_2$ and $\bar{\phi}_2$ is interrupted.

In the foregoing description, it was assumed that prior to the application of the clock signals $\phi_1(\bar{\phi}_1)$ and $\phi_2(\bar{\phi}_2)$ the output Q=1. A delayed output Q=1 means that the output before delay has been preserved without any change. Similarly, where the output before delay Q=0 the delayed output Q=0. Thus, where set input S=0 and reset input R=0, the output of the flip-flop circuit will be precisely equal to the value of output Q before application of inputs S and R. In other words, the condition of the output is preserved.

ii. Where S=1 and R=0, transistors 11N, 12P and 14P are rendered conductive, while transistors 11P, 12N and 14N are rendered nonconductive. The condition of the output of the delayed logic circuitry 2 is determined by the clock pulses $\phi_1$ and $\bar{\phi}_1$. Upon application of the clock pulses $\phi_1$ and $\bar{\phi}_1$, the output terminal 18 will be grounded through transistors 14P and 15P thereby producing an output 0. Then upon application of clock pulses $\phi_2$ and $\bar{\phi}_2$, transistors 25N, 25P and 21N are rendered conductive, whereas transistor 21P is rendered nonconductive. As a result, the output terminal 28 will be connected to the source of −E volts through transistors 21N and 25N thus producing an output condition of 1. Where the logical inputs S=1 and R=0, it will be clear that the output Q is forced to assume the state 1 irrespective of the condition of the previous output Q. In this manner, a set input S=1 will be preferentially obtained at the output of the flip-flop circuit.

iii. Where S=0 and R=1, transistors 11P, 12N and 14N are rendered conductive, while transistors 11N, 12P and 14P are rendered nonconductive. The output condition of the delayed logic circuitry 2 is determined by the clock pulses $\phi_1$ and $\bar{\phi}_1$ irrespective of the condition of output Q. As a result, upon application of the clock pulses $\phi_1$ and $\bar{\phi}_1$, the output terminal 18 will be connected to the source of −E volts through transistors 12N, 14N and 15N, thereby producing an output 1. Consequently, transistor 21P is rendered conductive, whereas transistor 21N nonconductive. Upon application of clock pulses $\phi_2$ and $\bar{\phi}_2$, the output terminal 28 will be grounded through transistors 21P and 25P, thus producing an output Q of 0. In the case where the logic inputs S=0 and R=1, the output Q is always 0. Again, the set input S dominates.

iv. Where S=1 and R=1, transistors 11P, 12N and 14P are rendered conductive and transistors 12P and 14N nonconductive. Upon application of the clock pulses $\phi_1$ and $\phi_1$, the output terminal 18 is grounded via transistors 14P and 15P, thus providing an output 0. Consequently, transistor 21N becomes conductive and transistor 21P nonconductive. When clock pulses $\phi_2$ and $\bar{\phi}_2$ are applied, output terminal 28 is connected to the source of −E volts through transistors 21N and 25N, thus producing an output Q of 1. Where logic inputs S=1 and R=1, the output Q will be 1 like the set input S.

Although foregoing description was made in terms of negative logic, in the case of positive logic, it is only necessary to substitute an OR-NAND gate for the AND-NOR gate circuit in the delayed logic circuitry 2.

Figure 1C:
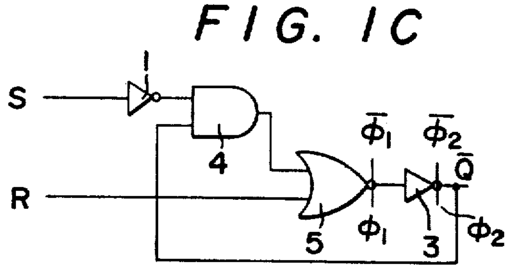
FIG. 1C shows a connection diagram of a reset dominant flip-flop circuit.

Although the embodiment shown in FIGS. 1A and 1B relates to a set dominant flip-flop circuit, a reset dominant flip-flop circuit can also be obtained by connecting the circuit as shown in FIG. 1C.

Figure 3A:
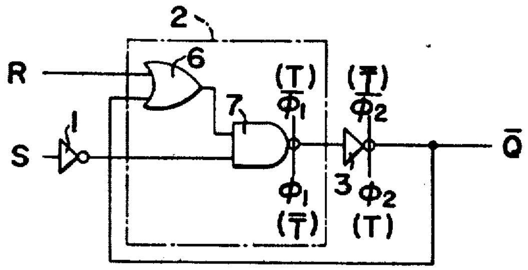
FIG. 3A shows a connection diagram of a modified set dominant flip-flop circuit.

FIG. 3A shows another example of the set dominant flip-flop circuit in which the reset input R is coupled to one input of an OR gate 6 and the set input S is coupled to one input of a NAND gate 7 via an inverter 1. The output Q of the flip-flop circuit is fed back to the other input of the gate 6.

Figure 3C:
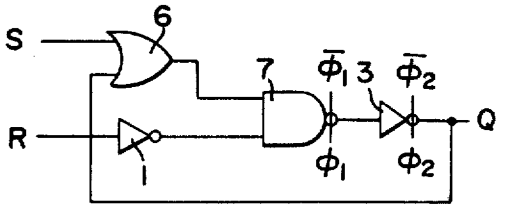
FIG. 3C is a connection diagram of a reset dominant flip-flop circuit.
Figure 3B:
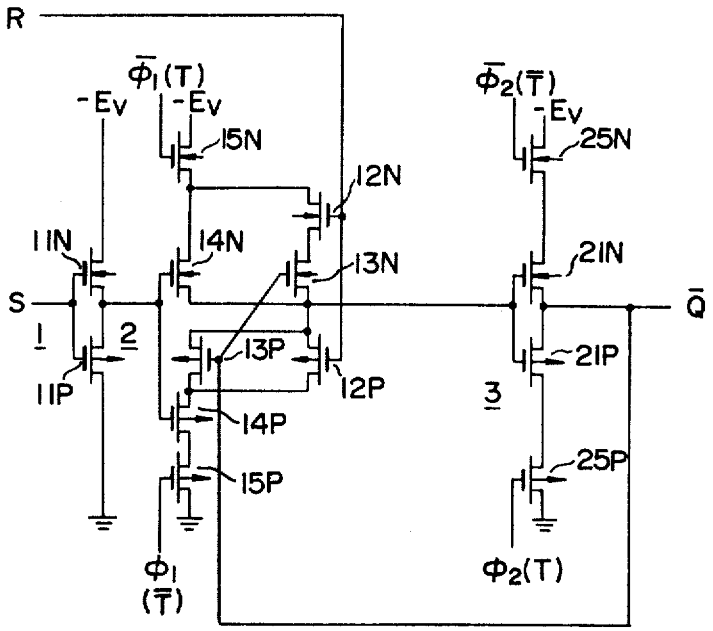
FIG. 3B shows a detailed circuit diagram of the modified flip-flop circuit shown in FIG. 3A.

FIG. 3B shows the detail of the construction of the flip-flop circuit shown in FIG. 3A, but the operation thereof can be readily understood from the foregoing description regarding the circuit shown in FIG. 1B.

FIG. 3C shows a connection diagram of a reset dominant flip-flop circuit which can be obtained by modifying the set dominant flip-flop circuit shown in FIG. 3A.

Figure 4:
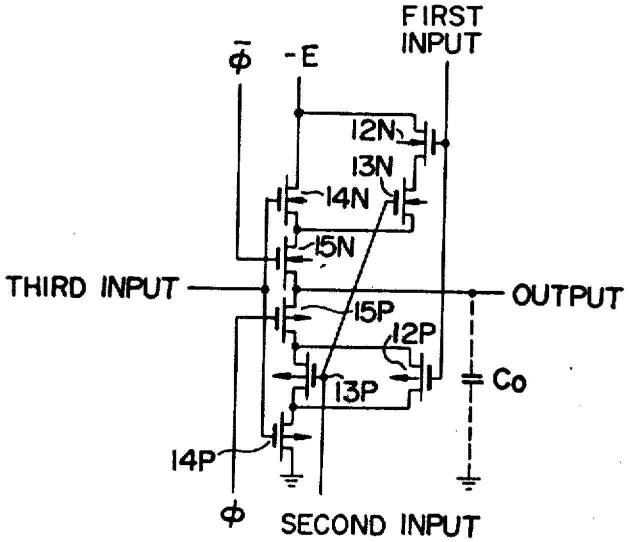
FIG. 4 shows a connection diagram of a modification of a portion of the circuit shown in FIG. 3B.

While in the circuits shown in FIGS. 1B and 3B, the construction of the delayed logic circuitry 2 is such that logic transistors 12N, 13N, 14N, 12P, 13P and 14P are sandwiched between clocked transistors 15N and 15P, it will be clear that the clocked transistors may be sandwiched between N channel logic transistors and P channel logic transistors. In the latter case, the output of the delayed logic circuitry is taken out from the junction between clocked transistors. The delayed logic circuitry shown in FIG. 4 operates in the same manner as that shown in FIG. 3B. In this connection, in the clocked inverter shown in FIGS. 1B and 3B, it will be noted that clocked transistors 25N and 25P may be sandwiched between transistors 21N and 21P.

The flip-flop circuits described above are of the dynamic type and are suitable for use with high frequency clock signals. If the frequency of the clock pulses were too low, that is the interval between pulses were too long, the data temporarily stored in the output capacitances $C_{20}$ and $C_{30}$, respectively, during the interval would discharge through parasitic elements or the like in the integrated circuit chip, thus causing an erroneous operation. For this reason, in order to construct a static type flip-flop circuit that can operate stably at a low frequency clock signal it is necessary to provide a stabilizing circuit on the output side of respective clocked circuits so as to prevent discharge of the data in the periods other than the operating periods of respective clocked circuits, that is, during the data storing period.

Figure 5A:
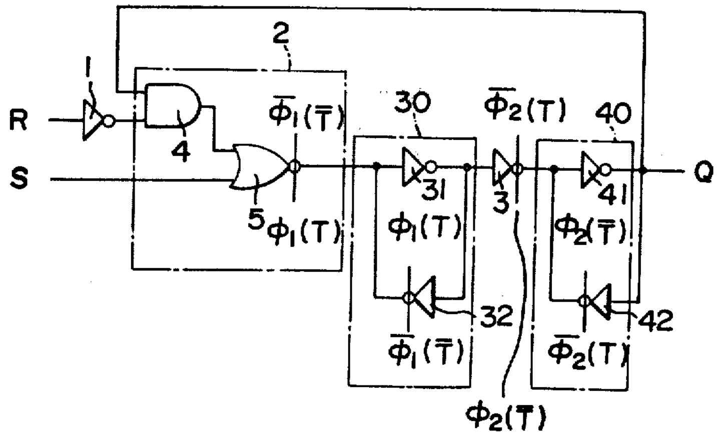
FIG. 5A shows a connection diagram of a static flip-flop circuit utilizing the construction of the circuit shown in FIG. 1A.

FIG. 5A shows an improved static type flip-flop circuit in which first and second stabilizing circuits 30 and 40 are provided on the output side of the delayed logic circuitry 2 and the clocked inverter 3 of the dynamic type flip-flop circuit shown in FIG. 1A, respectively. The first stabilizing circuit 30 comprises an inverter 31 having similar construction as that of inverter 1 for coupling the complement of the output from the delayed logic circuitry 2 to the clocked inverter 3, and a clocked inverter 32 having similar construction as that of the clocked inverter 3 and functions to feedback the output of inverter 31 to its input. The clocked inverter 32 is supplied with clock pulses $\phi_1$ and $\bar{\phi}_1$ such that it will not operate while the delayed logic circuitry 2 is operated by the clock pulses $\bar{\phi}_1$ and $\phi_1$ but operate while the delayed logic circuitry 2 is inoperative. In the same manner, the second stabilizing circuit 40 comprises an inverter 41 and a clocked inverter 42. The clocked inverter 42 is supplied with clock pulses $\phi_2$ and $\bar{\phi}_2$ such that it will not operate while clocked inverter 3 is operated by clock pulses $\bar{\phi}_2$ and $\phi_2$ but operate while the clocked inverter 3 does not operate.

Let us now assume that the delayed logic circuitry 2 produces an output 1 in synchronism with clock pulses $\bar{\phi}_1$ and $\phi_1$. This output 1 is stored in the output capacitance and is preserved during the operating period of the delayed logic circuitry 2. During the quiescent period of the delayed logic circuitry 2, the clocked inverter 32 is in its operated condition. The output 1 is inverted by inverter 31 into an output 0 which, in turn, is converted into 1 by the action of the clocked inverter 32. As a result, the output 1 from the delayed logic circuitry would not be discharged during the quiescent period thereof, but preserved. The second stabilizing circuit 40 operates in the same manner.

Figure 5B:
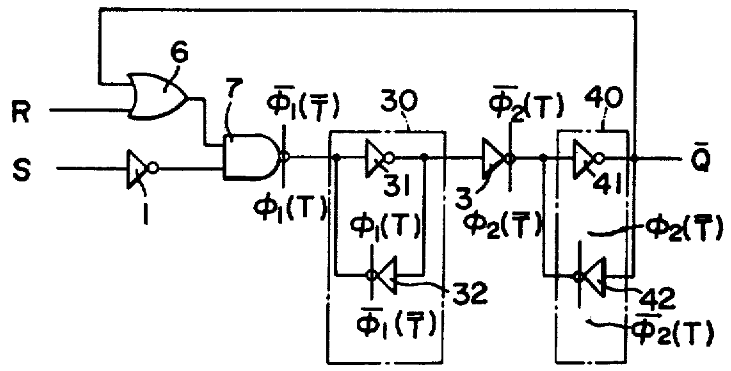
FIG. 5B shows a connection diagram of a static flip-flop circuit utilizing the construction of the circuit shown in FIG. 3A.

FIG. 5B shows a modified static flip-flop circuit in which stabilizing circuits 30 and 40 similar to those shown in FIG. 5A are added to the dynamic flip-flop circuit shown in FIG. 3A.

Figure 6A:
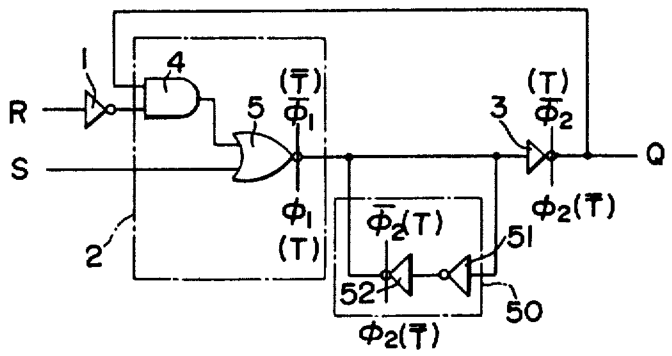
FIG. 6A shows a connection diagram of a semi-static flip-flop circuit utilizing the construction of the circuit shown in FIG. 1A.
Figure 6B:
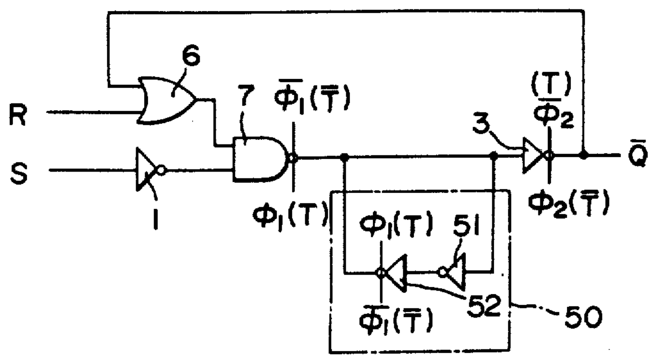
FIG. 6B shows a connection diagram of a semi-static flip-flop circuit utilizing the construction shown in FIG. 3B.

FIGS. 6A and 6B show semi-static flip-flop circuits in which a stabilizing circuit 50 is provided for the output side of only one clocked circuit which receives a clock signal of lower frequency where the frequency of the clock signal $\phi_1$ ($\bar{\phi}_1$) applied to the delayed logic circuitry 2 is not equal to the frequency of the clock signal $\phi_2$ ($\bar{\phi}_2$) supplied to the clocked inverter 3 (where the frequency of the clock signal $\phi_1$ is lower than that the clock signal $\phi_2$, the delayed logic circuitry 2). In these circuits while it is possible to use a stabilizing circuit 50 similar to those shown in FIGS. 5A and 5B, the stabilizing circuit 50 utilized in FIGS. 6A and 6B comprises a series combination of an inverter 51 and a clocked inverter 52 which is connected in parallel with the connection line between delayed logical circuitry 2 and inverter 3. The stabilizing circuit 50 operates in the same manner as the stabilizing circuit 30 shown in FIG. 5A.

Figure 7A:
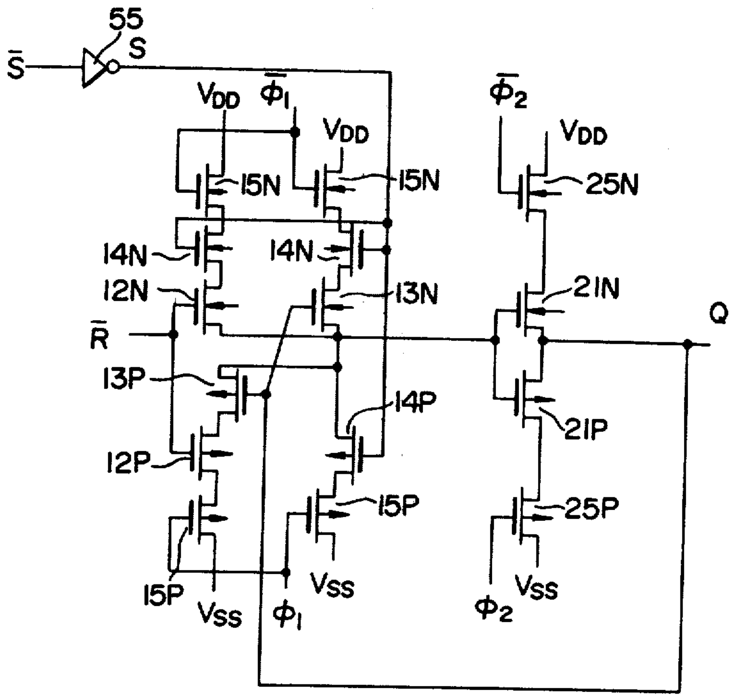
FIG. 7A shows a modification of the flip-flop circuit shown in FIG. 1B.

FIG. 7A shows a modification of the flip-flop circuit shown in FIG. 1A, which comprises two clocked transistors 15N, two clocked transistors 15P and two logic transistors 14N.

Figure 7B:
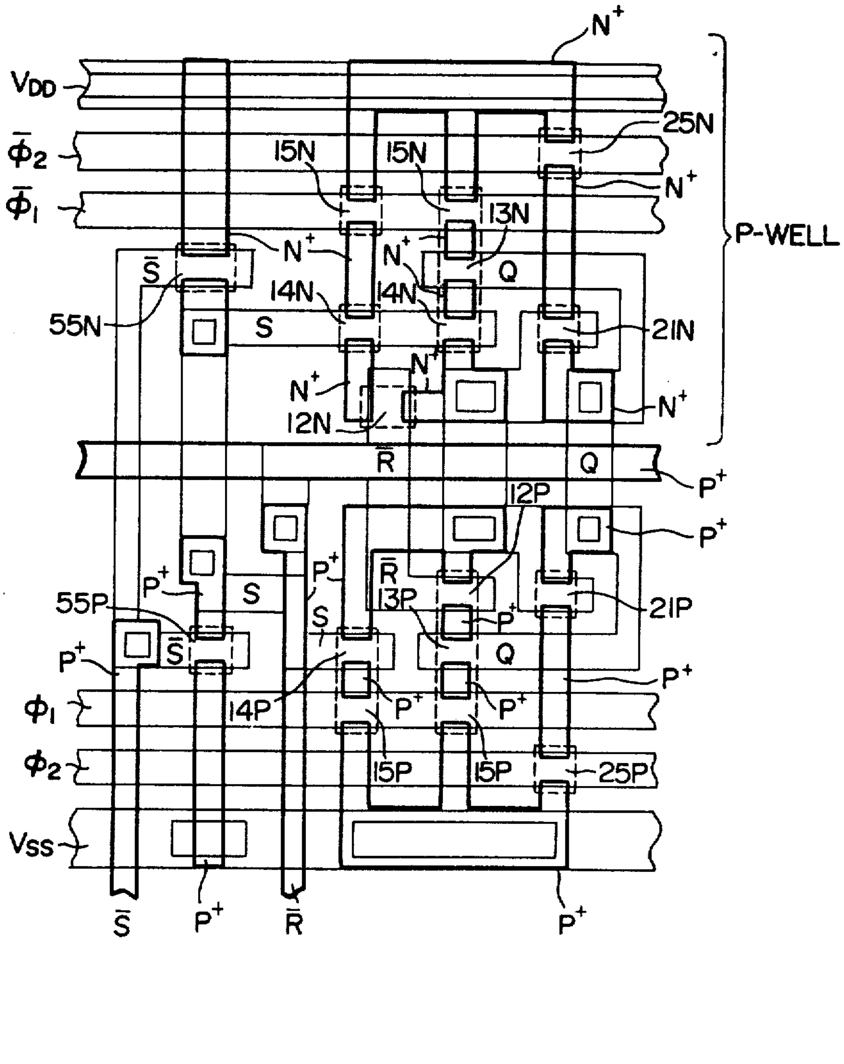
FIG. 7B shows a pattern diagram of the integrated circuit shown in FIG. 7A.

FIG. 7B shows a pattern diagram of the flip-flop circuit shown in FIG. 7A which is formed as an integrated circuit. In FIG. 7B, an N channel transistor 55N and a P channel transistor 55P cooperate to constitute an inverter 55 shown in FIG. 7A.

What is claimed is:

1. A flip-flop circuit utilizing insulated gate field effect transistors, comprising:

a source of first and second logical inputs;

a source of operating voltage;

a source of first complementary clock signals;

first inverter means including a complementary pair of field effect transistors for receiving and reversing the polarity of said first logical input;

delayed logic circuit means comprising first to fourth transistors of one channel type each including source and drain regions defining therebetween a conduction path and a gate electrode, and fifth to eighth transistors of the other channel type each including source and drain regions defining therebetween a conduction path and a gate electrode, the conduction paths of said first and second transistors being coupled in parallel, the conduction path of said third transistor being connected in series with that of said first transistor, the conduction paths of said fifth and sixth transistors being connected in series, the conduction path of said seventh transistor being connected in parallel with serially connected conduction paths of said fifth and sixth transistors, the conduction path of said second transistor being connected in series with that of said seventh transistor, the conduction path of said fourth transistor being connected between the conduction path of said third transistor and one terminal of said source of operating voltage, the conduction path of said eighth transistor being connected between the conduction path of said fifth transistor and the other terminal of said source of operating voltage, the gate electrodes of said first and fifth transistors being connected in common to receive the output of said first inverter means, the gate electrodes of said second and sixth transistors being connected in common to receive an output of said flip-flop circuit, the gate electrodes of said third and seventh transistors being connected in common to receive said second logical input, the gate electrodes of said fourth and eighth transistors being connected to said clock signal source to receive respectively complementary clock signals, and the junction between the conduction paths of said second and seventh transistors comprising an output of said delayed logic circuit means; and second inverter means coupled to the output of said delayed logic circuit means, and including a complementary pair of field effect transistors for receiving and reversing the polarity of the outputs of said delayed logic circuit means to provide the output of said flip-flop circuit;

whereby when the states of first and second logical inputs are in a predetermined combination, the output state of the flip-flop circuit is held, and when the states of said first and second logical inputs are in other combinations, either one of said first and second logical inputs is dominantly derived out on the output side in response to said clock signals.

2. A flip-flop circuit according to claim 1 wherein said first to eighth transistors comprise an AND gate for receiving two inputs and a NOR gate for receiving the output of said AND gate and another one input.

3. A flip-flop circuit according to claim 1 wherein said first to eighth transistors comprise an OR gate for receiving two inputs, and a NAND gate for receiving the output of said OR gate circuit and another one input.

4. A flip-flop circuit according to claim 1 which further comprises a stabilizing circuit connected to the output of said delayed logic circuit means for holding the output voltage of said logic circuit means for a predetermined length of time after said delayed logic circuit means has operated.

5. A flip-flop circuit according to claim 4 wherein said stabilizing circuit comprises an inverter including a complementary pair of field effect transistors, and a clocked inverter having a complementary pair of field effect transistors, the input of said clocked inverter being connected to the output of said inverter and the output of said clocked inverter being connected to the input of said inverter.

6. A flip-flop circuit according to claim 4 wherein said stabilizing circuit comprises an inverter including a complementary pair of field effect transistors, and a clocked inverter including a complementary pair of field effect transistors and connected in cascade with said inverter.

7. A flip-flop circuit according to claim 1 comprising a source of second complementary clock signals, and wherein said second inverter means comprises clocked means which are enabled by said second complementary clock signals for reversing the polarity of the output of said delayed logical circuit means after an output is derived out from said delayed logical circuit means in synchronism with said first complementary clock signals.

8. A flip-flop circuit according to claim 7 which further comprises a first stabilizing circuit connected to the output of said delayed logic circuit means for holding the output voltage thereof for a predetermined length of time after said delayed logic circuit means has operated, and a second stabilizing circuit connected to the output of said second inverter means for holding the output voltage thereof for a predetermined length of time after said second inverter means has operated.

9. A flip-flop circuit according to claim 8 wherein each of said first and second stabilizing circuits comprises an inverter including a complementary pair of field effect transistors, and a clocked inverter including a complementary pair of field effect transistors, the input of said clocked inverter being connected to the output of said inverter and the output of said clocked inverter being connected to the input of said inverter.

10. A flip-flop circuit according to claim 8 wherein each of said first and second stabilizing circuits comprises an inverter including a complementary pair of field effect transistors, and a clocked inverter including a complementary pair of field effect transistors and connected in cascade with said inverter.

11. A flip-flop circuit according to claim 7 wherein said first and second clock signals have different frequencies and which further comprises a stabilizing circuit connected to the output of one of said delayed logic circuit means and said second inverter means, and being supplied with a clock signal have a lower frequency for holding the output of said one means for a predetermined length of time after said one means has operated.

12. A flip-flop circuit according to claim 11 wherein said stabilizing circuit comprises an inverter including a complementary pair of field effect transistors, and a clocked inverter including a complementary pair of field effect transistors and connected in cascade with said inverter.

13. A flip-flop circuit according to claim 11 wherein said stabilizing circuit comprises an inverter including a complementary pair of field effect transistors, and a clocked inverter including a complementary pair of field effect transistors, the input of said clocked inverter being connected to the output of said inverter and the output of said clocked inverter being connected to the input of said inverter.

14. A flip-flop circuit utilizing insulated gate field effect transistors, comprising:

a source of first and second logical inputs;

a source of operating voltage;

a source of first complementary clock signals;

first inverter means including a complementary pair of field effect transistors for receiving and reversing the polarity of said first logical input;

delayed logic circuit means comprising first to fourth transistors of one channel type each including source and drain regions defining therebetween a conduction path and a gate electrode, and fifth to eighth transistors of the other channel type each including source and drain regions defining therebetween a conduction path and a gate electrode, the conduction paths of said first and second transistors being coupled in parallel, the conduction path of said third transistor being connected in series with that of said first transistor, the conduction paths of said fifth and sixth transistors being connected in series, the conduction path of said seventh transistor being arranged in parallel with serially connected conduction paths of said fifth and sixth transistors, the conduction path of said second transistor being connected in series with that of said seventh transistor, the conduction paths of said fourth and eighth transistors being connected in series between the conduction paths of said second and said seventh transistors, the conduction paths of said first, third, fourth, seventh and eighth transistors being connected in series across said source of operating voltage, the gate electrodes of said first and fifth transistors being connected in common to receive said second logical input, the gate electrodes of said second and sixth transistors being connected in common to receive the output of said flip-flop circuit, the gate electrodes of said third and seventh transistors being connected in common to receive the output of said first inverter means, the gate electrodes of said fourth and eighth transistors being connected to said clock signal source to receive respective complementary clock signals, and the junction between the conduction paths of said fourth and eighth transistors comprising an output of said delayed logic circuit means; and second inverter means coupled to the output of said delayed logic circuit means, and including a complementary pair of field effect transistors for receiving and reversing the polarity of the outputs of said delayed logic circuit means to provide the output of said flip-flop circuit;

whereby when the states of first and second logical inputs are in a predetermined combination, the output state of the flip-flop circuit is held, and when the states of said first and second logical inputs are in other combinations, either one of said first and second logical inputs is dominantly derived out on the output side in response to said clock signals.

15. A flip-flop circuit according to claim 14 comprising a source of second complementary clock signals, and wherein said second inverter means comprises clocked means which are enabled by said second complementary clock signals for reversing the polarity of the output of said delayed logical circuit means after an output is derived out from said delayed logical circuit means in synchronism with said first complementary clock signals.

16. A flip-flop circuit according to claim 15 which further comprises a first stabilizing circuit connected to the output of said delayed logic circuit means for holding the output voltage thereof for a predetermined length of time after said delayed logic circuit means has operated, and a second stabilizing circuit connected to the output of said second inverter means for holding the output voltage thereof for a predetermined length of time after said second inverter means has operated.

17. A flip-flop circuit according to claim 16 wherein each of said first and second stabilizing circuits comprises an inverter including a complementary pair of field effect transistors, and a clocked inverter including a complementary pair of field effect transistors, the input of said clocked inverter being connected to the output of said inverter and the output of said clocked inverter being connected to the input of said inverter.

18. A flip-flop circuit according to claim 16 wherein each of said first and second stabilizing circuits comprises an inverter including a complementary pair of field effect transistors, and a clocked inverter including a complementary pair of field effect transistors and connected in cascade with said inverter.

19. A flip-flop circuit according to claim 15 wherein said first and second clock signals have different frequencies and which further comprises a stabilizing circuit connected to the output of one of said delayed logic circuit means and said second inverter means, and being supplied with a clock signal having a lower frequency for holding the output of said one means for a predetermined length of time after said one means has operated.

20. A flip-flop circuit according to claim 19 wherein said stabilizing circuit comprises an inverter including a complementary pair of field effect transistors, and a clocked inverter including a complementary pair of field effect transistors and connected in cascade with said inverter.

21. A flip-flop circuit according to claim 19 wherein said stabilizing circuit comprises an inverter including a complementary pair of field effect transistors, and a clocked inverter including a complementary pair of field effect transistors, the input of said clocked inverter being connected to the output of said inverter and the output of said clocked inverter being connected to the input of said inverter.

22. A flip-flop circuit according to claim 14 which further comprises a stabilizing circuit connected to the output of said delayed logic circuit means for holding the output voltage of said logic circuit means for a predetermined length of time after said delayed logic circuit means has operated.

23. A flip-flop circuit according to claim 22 wherein said stabilizing circuit comprises an inverter including a complementary pair of field effect transistors, and a clocked inverter having a complementary pair of field effect transistors, the input of said clocked inverter being connected to the output of said inverter and the output of said clocked inverter being connected to the input of said inverter.

24. A flip-flop circuit according to claim 22 wherein said stabilizing circuit comprises an inverter including a complementary pair of field effect transistors, and a clocked inverter including a complementary pair of field effect transistors and connected in cascade with said inverter.

* * * * *